United States Patent
Davidson

[19]

[11] Patent Number: 5,940,345
[45] Date of Patent: Aug. 17, 1999

[54] COMBINATIONAL LOGIC FEEDBACK CIRCUIT TO ENSURE CORRECT POWER-ON-RESET OF A FOUR-BIT SYNCHRONOUS SHIFT REGISTER

[75] Inventor: Colin A. Davidson, Basingstoke, United Kingdom

[73] Assignee: Cypress Semiconductor Corp., San Jose, Calif.

[21] Appl. No.: 08/990,126

[22] Filed: Dec. 12, 1997

[51] Int. Cl.[6] ........................................ G11C 8/00
[52] U.S. Cl. ................................................ 365/238.5
[58] Field of Search ................ 365/238.5, 221, 365/194, 189.08

[56] References Cited

U.S. PATENT DOCUMENTS

| | | | |
|---|---|---|---|
| 4,044,339 | 8/1977 | Berg | 340/173 R |
| 4,443,847 | 4/1984 | Bradley et al. | 364/200 |
| 4,446,381 | 5/1984 | Dalrymple | 307/200 |
| 4,453,212 | 6/1984 | Gaither et al. | 364/200 |
| 4,590,551 | 5/1986 | Mathews | 364/200 |
| 4,631,707 | 12/1986 | Watanabe | 365/226 |
| 4,788,454 | 11/1988 | Tanagawa et al. | 307/296 |
| 4,789,967 | 12/1988 | Liou et al. | 365/189 |
| 4,797,584 | 1/1989 | Aguti | 307/594 |
| 4,873,671 | 10/1989 | Kowshik et al. | 365/189 |
| 4,874,965 | 10/1989 | Campardo et al. | 307/272.3 |
| 4,886,984 | 12/1989 | Nakaoka | 307/272.3 |
| 4,888,498 | 12/1989 | Kadakia | 307/296.4 |
| 4,924,375 | 5/1990 | Fung et al. | 364/200 |
| 4,969,126 | 11/1990 | Maeno | 365/240 |
| 4,970,408 | 11/1990 | Hanke et al. | 307/272.3 |
| 4,983,857 | 1/1991 | Steele | 307/272.3 |
| 5,047,989 | 9/1991 | Canepa et al. | 365/238.5 |
| 5,115,146 | 5/1992 | McClure | 307/272.3 |
| 5,121,358 | 6/1992 | Slemmer et al. | 365/226 |
| 5,231,603 | 7/1993 | Luhrmann | 365/189.03 |
| 5,237,219 | 8/1993 | Cliff | 307/465 |
| 5,243,233 | 9/1993 | Cliff | 307/296.4 |
| 5,343,085 | 8/1994 | Fujimoro et al. | 307/272.3 |
| 5,359,233 | 10/1994 | Mumper et al. | 307/279.3 |
| 5,361,371 | 11/1994 | Kawamoto et al. | 395/800 |
| 5,404,543 | 4/1995 | Faucher et al. | 395/750 |
| 5,410,514 | 4/1995 | Miyatake | 365/238.5 |
| 5,477,176 | 12/1995 | Chang et al. | 327/143 |
| 5,485,428 | 1/1996 | Lin | 365/221 |
| 5,526,318 | 6/1996 | Slemmer et al. | 365/226 |
| 5,621,692 | 4/1997 | Lin | 365/221 |

FOREIGN PATENT DOCUMENTS

| | | |
|---|---|---|
| 0032014 A2 | 7/1981 | European Pat. Off. . |
| 0102618 A2 | 3/1984 | European Pat. Off. . |
| 1 179 651 A2 | 4/1986 | European Pat. Off. . |

*Primary Examiner*—David Nelms
*Assistant Examiner*—Anh Phung
*Attorney, Agent, or Firm*—Christopher P. Maiorana, P.C.

[57] ABSTRACT

A combinational logic feedback circuit ensures correct power-on-reset of a 4-bit synchronous shift register used to generate a plurality of page select signals. The combinational circuit monitors the plurality of page select signals and asserts an invalidity signal when an invalid state is detected. A deglitch circuit inhibits or suppresses glitches which may be output from the combinational circuit due to state transitions of one or more of the page select signals. The deglitch circuit generates in response thereto a reset signal which is applied to the synchronous shift register to reset the shift register to output a valid state.

13 Claims, 4 Drawing Sheets

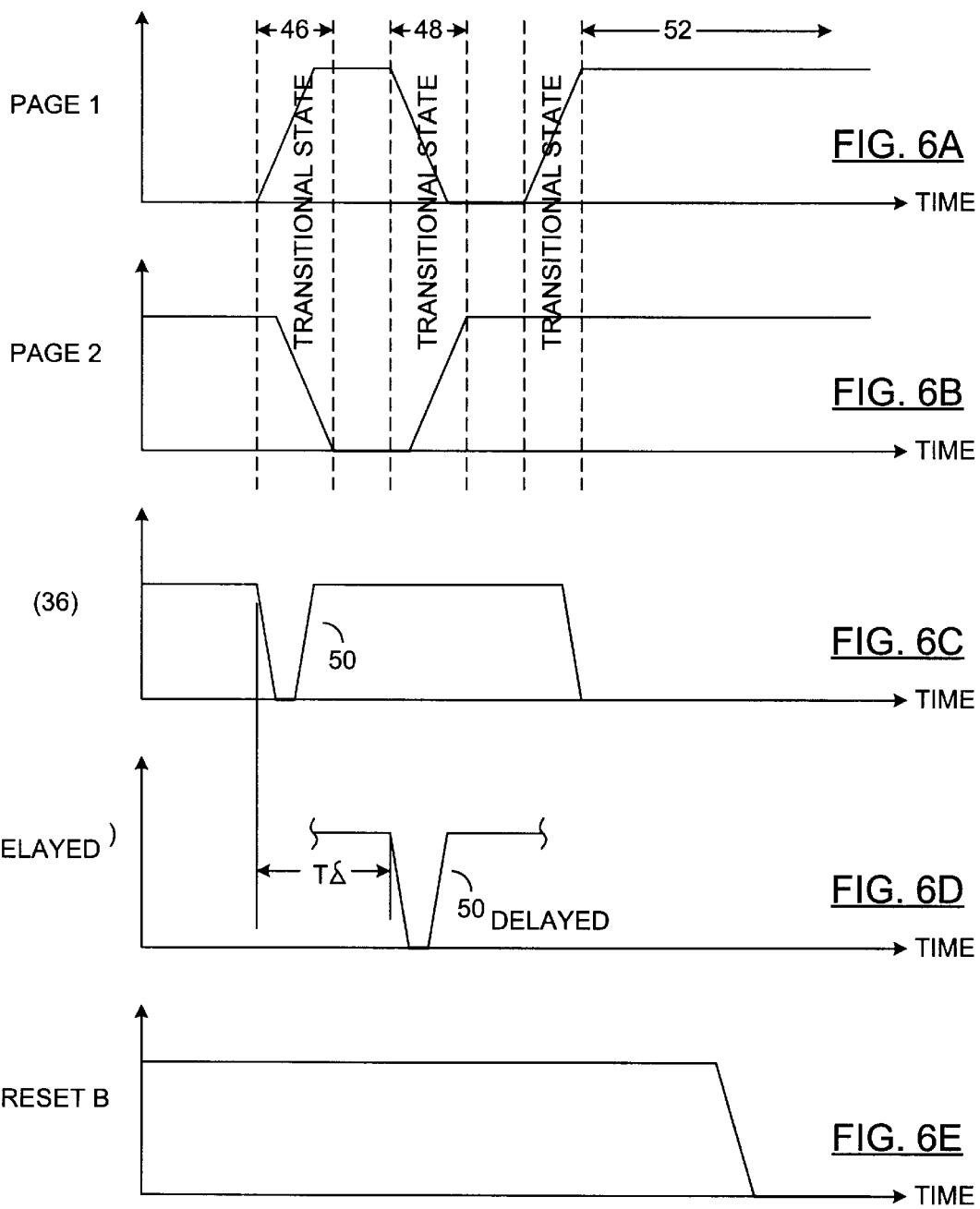

COMBINATIONAL LOGIC FEEDBACK CIRCUIT TO ENSURE CORRECT POWER-ON-RESET OF A FOUR-BIT SYNCHRONOUS SHIFT REGISTER

BACKGROUND OF THE INVENTION

1. Technical Field

This invention relates generally to integrated circuits, and, more particularly, to a circuit for an integrated circuit memory to provide a power-on-reset function, as well as to provide the function of determining whether a plurality of page select signals for selecting a page of memory define a valid state.

2. Discussion of the Related Art

It is known to segregate the storage portion of integrated circuit memories into two or more so-called pages. For such memories, page select signals may be generated for storage and retrieval operations to the various memory pages. It is important to ensure that only one memory page is enabled during power-up, and during normal operations. In addition, access to such a memory may be made synchronously in a so-called burst mode. Commonly, such a memory may be a static random access memory (SRAM).

One approach for memory page access to implement the burst mode is to use a burst counter in combination with a postdecoder circuit to generate the above-mentioned page select signals. The generated page select signals are then applied to the memory array to access the selected page. However, such an approach may not perform fast enough under certain circumstances to meet state-of-the-art performance standards. Another approach taken in the art has been to use a combination of a decoder circuit, and a synchronous shift register. However, such a configuration may generate an invalid output under certain circumstances, for example during power-up. It is known, then, to use a global (i.e., one used for the entire integrated circuit) power-on-reset (POR) circuit to ensure that the shift register outputs a valid state (i.e., only one memory page selected at a time). However, there is no guarantee that a global power-on-reset circuit will always produce a reset pulse at power-up. This may result in the shift register powering up in an invalid state—an undesirable situation. Moreover, a global power-on-reset circuit is generally designed to generate a reset pulse on power-up only. Should the shift register somehow output an invalid state after power-up, it will not be reset to a valid state by the global power-on-reset circuit.

Accordingly, there is a need to provide an improved memory page select mechanism for use in an integrated circuit that minimizes or eliminates one or more of the problems as set forth above.

SUMMARY OF THE INVENTION

It is an object of the present invention to provide an integrated circuit having a memory with plurality of memory pages wherein only one memory page is enabled at a time. Specifically, it is a further object of the present invention to ensure that only one memory page is enabled during power-up of the device, and, during normal operations. It is yet a further object of the present invention to provide an integrated circuit memory that meets state-of-the-art performance standards.

To achieve these and other objects, and in accordance with the present invention, an integrated circuit having a memory is provided that includes a page enable circuit, and a reset signal generating means. The page enable circuit is configured to generate a plurality of page select signals to enable a selected one of a plurality of pages of the memory. The reset signal generating means is configured to generate a reset signal when the page select signals (preferably, collectively) define an invalid state. The reset signal is then fed back to the page enable circuit, which is further configured to "reset" in response to the reset signal. When "reset", the page select signals are generated in a valid state. The invention employs feedback based on the page select signals to ensure that the page enable circuit outputs a valid state (i.e., in a preferred embodiment, a state which enables only a selected one of the memory pages at a time). The invention is effective both during power-up of the integrated circuit, as well as during normal operation thereafter.

In a preferred embodiment, the page enable circuit includes a synchronous shift register which generates the page select signals in accordance with a clock signal (i.e., synchronously). One advantage is that the method/system for performing the Power-On-Reset according to the invention requires no static power consumption.

Other objects, features, and advantages of the present invention will become apparent to one skilled in the art from the following detailed description and accompanying drawings illustrating features of this invention by way of example, but not by way of limitation.

BRIEF DESCRIPTION OF THE DRAWINGS

FIGS. 6A–6E are timing diagrams showing waveforms in accordance with the operation of the present invention.

DETAILED DESCRIPTION OF THE PREFERRED EMBODIMENTS

Figure 1:
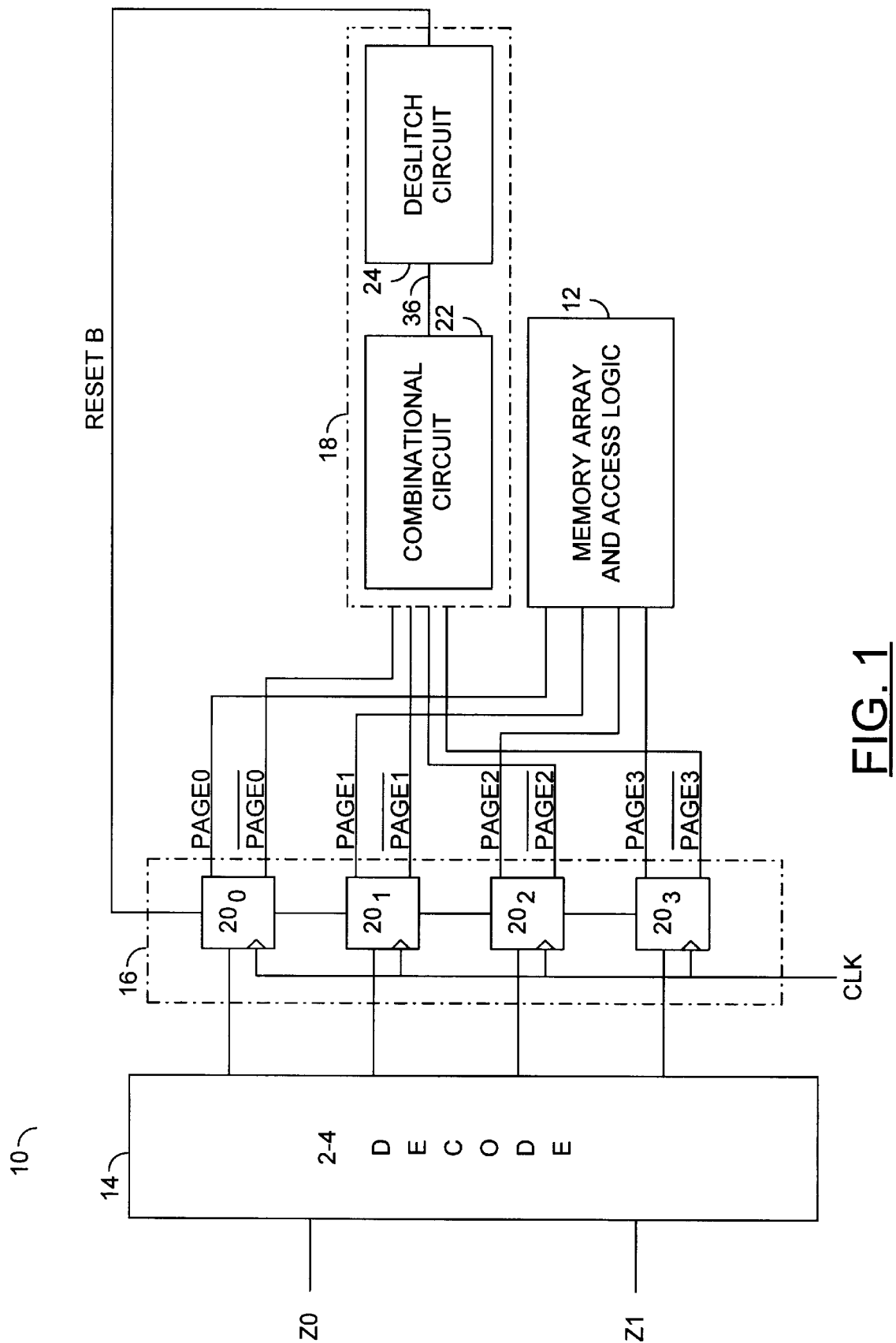
FIG. 1 is a simplified block diagram view of an integrated circuit in accordance with the present invention.

Referring now to the drawings wherein like reference numerals are used to identify identical components in the various views, FIG. 1 shows an integrated circuit, such as a static random access memory (SRAM) 10, in accordance with the present invention. In a constructed embodiment, integrated circuit 10 may be a 2 Megabit (64k×32-bit) synchronous pipelined cache SRAM device of the type in which the memory is segregated into four pages of 16k×32-bit capacity each. Integrated circuit 10 may include a memory array and access logic block 12, a decoder 14, a page select circuit 16, and means or circuit 18 for generating a reset signal, designated RESETB in the figures.

Memory array and access logic 12 includes (i) a memory array, which may be arranged in 32-bit words in multiple pages, and (ii) an access logic block. The memory array is provided for storage and retrieval of data, as is well-known. The access logic block may be responsive to a plurality of page select signals PAGE0, PAGE1, PAGE2, and PAGE3 for enabling a selected one of the memory pages of the memory array for such data storage and retrieval operations thereto. For purposes of this invention, memory array and access logic block 12 may comprise conventional and well-known structures, and will therefore not be described in further detail.

Decoder 14 provides a conventional decoding function. That is, in the illustrated embodiment, decoder 14 receives two (2) digital input signals, namely Z0 and Z1, and asserts, in response thereto, one of four output lines. The signal on each output line is associated, with a respective page of memory. Decoder 14 may comprise conventional decoding structures well-known to those of ordinary skill in the art.

Page select circuit 16 is configured to generate a plurality of page select signals, designated PAGE0, PAGE1, PAGE2, and PAGE3, to enable a selected one of the plurality of pages of memory 12. Circuit 16 also generates the complement of the page select signals, namely, $\overline{\text{PAGE0}}$, $\overline{\text{PAGE1}}$, $\overline{\text{PAGE2}}$, and $\overline{\text{PAGE3}}$. Preferably, page select circuit 16 comprises a synchronous shift register 20 that includes individual registers $20_0$, $20_1$, $20_2$, and $20_3$. The synchronous shift register is configured to receive a clock signal in accordance with which respective input signals (from decoder 14) are transferred to respective output signals on output lines thereof. These output signals define the page select signals (PAGE0, PAGE1, PAGE2, and PAGE3). In addition, synchronous shift register 20 is further configured to receive a reset signal, designated RESETB, from reset signal generating means 18 and, in response thereto, generate the page select signals in a valid state. For purposes of the present invention, and in the context of the particular memory array 12 used in integrated circuit 10, a valid state may be a state in which only one of the pages of memory are enabled at a time. In a constructed embodiment, therefore, valid states for the output of shift register 20 are predefined as follows: [PAGE3, PAGE2, PAGE1, PAGE0]=[1,0,0,0], [0,1,0,0], [0,0,1,0], [0,0,0,1]. All other output combinations of synchronous shift register 20 may be considered to define an invalid state, in the constructed embodiment.

It should be understood that decoder 14 may be provided with signals Z0, Z1 in advance of the ti me that the clock signal causes shift register 20 to capture the data on its respective input lines. That is, the decoding function, in the preferred embodiment can be done before the decoded output is needed, so that when the clock signal comes, the page select signals are already decoded and available. This aspect permits a faster clock-to-select time. In contrast, with the counter/postdecoder configuration mentioned in the Background, the decoding function occurs with every clock signal (i.e., the counter must be incremented using the clock signal [delay1], and then the counter output is decoded using the decoder [delay2]). This counter/post decoder configuration may be slower than the configuration (decoder/shift register) employed in the preferred embodiment.

In one embodiment having four pages of memory, the approach according to the invention (i.e., a combination decoder/burst shift register) exhibited, under simulation, an improved page select time compared to the approach employing a burst counter/postdecoder combination. In addition, a preferred embodiment according to the invention may implemented using 20% less semiconductor die area than an embodiment employing a counter/decoder combination.

Means or circuit 18 is configured to generate a reset signal, designated RESETB, when the page select signals, namely PAGE0, PAGE1, PAGE2 and PAGE3, define an invalid state. In a constructed embodiment, the invalid state is one of the plurality of states other than the valid states set forth above. Moreover, in a preferred embodiment, the complement of the page select signals are processed. In a preferred embodiment, reset signal generating means 18 may include a combinational circuit 22, and a deglitch circuit 24.

Combinational circuit 22 may be configured to assert an invalidity signal when the page select signals define an invalid state. Deglitch circuit 24 may be configured to inhibit or suppress asserted conditions of the invalidity signal that are not indicative of an invalid state (i.e., "false reset signals") to generate the reset signal RESETB. For example, due to the state transitions of the page select signals, momentary "glitches" or "false reset signals" may be output from combinational circuit 22. Deglitch circuit 24 inhibits or suppresses such false reset signals, particularly those of a type that have a pulsewidth up to and including a predetermined pulsewidth. The rationale is that the "glitches" which arise from state transitions and/or unequal propagation paths will be of relatively short duration, while a true invalid condition (as defined by the page select signals) may persist for a longer period of time than the predetermined pulsewidth. Accordingly, since deglitch circuit 24 inhibits "false reset signals," it outputs a true reset signal indicative of an invalid state, as defined by the page select signals output from synchronous shift register 20. In addition, use of deglitch circuit 24 in circuit 18 removes the requirement that the propagation delay of every path through combinational circuit 22 be equalized. This results in a simpler and smaller design for circuit 22.

Figure 2:
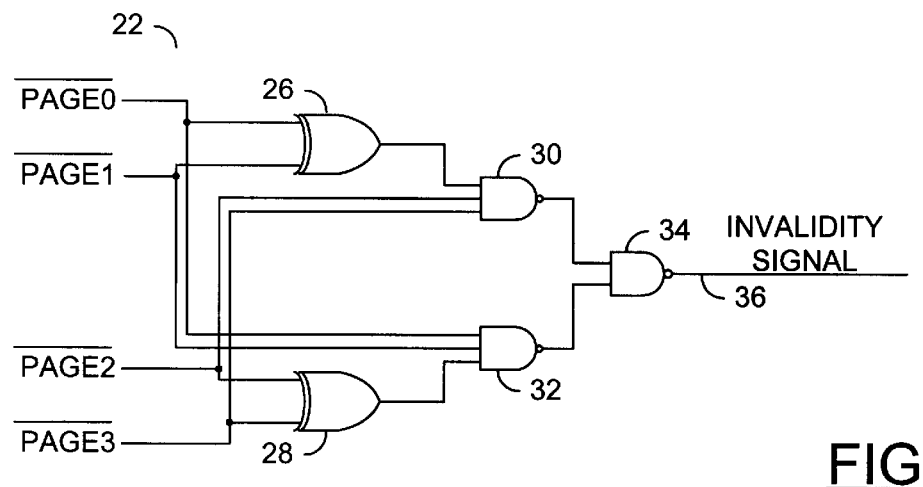
FIG. 2 is a simplified schematic diagram view, showing in greater detail, one embodiment of a combinational circuit shown in FIG. 1 in block diagram form.

FIG. 2 shows one embodiment of combinational circuit 22. Circuit 22 may include a first exclusive OR gate 26, a second exclusive OR gate 28, a first NAND gate 30, a second NAND gate 32, and a third NAND gate 34. The complement of page select signals PAGE0, PAGE1, PAGE2, and PAGE3, in a constructed embodiment, are applied to gates 26, 28, 30, and 32 to generate an invalidity signal 36. The invalidity signal 36 is, in one embodiment, a logic high when the page select signals define a valid state. When the plurality of page select signals assume an invalid state, even momentarily, then the invalidity signal will, in the illustrated embodiment, transition to a logic low state. It should be appreciated that the circuit illustrated in FIG. 2 is but one realization operative to generate an invalidity signal 36 when the page select signals collectively define an invalid state. In the general case, combinational circuit 22 may be any logic circuit which performs the function defined as follows:

IF the input to such a combinational circuit=a predefined valid state, THEN output a first signal, ELSE output a second signal wherein the first signal is distinguishable from the second signal.

For a circuit having N-output latches, for example, such as synchronous shift register 20, the number of possible output states equals $2^N$. The number of valid states, K, should be less than the total number of possible output states, namely, $K<2^N$.

Figure 3:
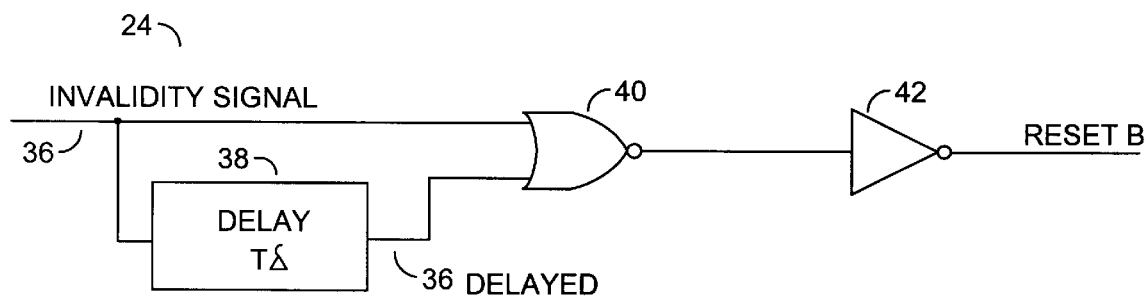
FIG. 3 is a simplified schematic and block diagram view showing, in greater detail, a deglitch circuit shown in FIG. 1 in block diagram form.

FIG. 3 shows a simplified schematic and block diagram view of deglitch circuit 24, may which include a delay circuit 38, a NOR gate 40, and an inverter 42.

The delay circuit 38 is configured to receive the invalidity signal 36, and generate (in response thereto) a delayed version of the invalidity signal, designated $36_{delayed}$. NOR gate 40 is configured to receive the invalidity signal 36, and the delayed version of the invalidity signal $36_{delayed}$, and generate an output, which is provided to inverter gate 42. Inverter gate 42 then inverts its input to generate the reset signal, designated RESETB, on an output terminal thereof.

Delay circuit 38 is specifically configured to delay invalidity signal 36 by an amount equal to Tδ. This action results in a situation where the delayed version of invalidity signal $36_{delayed}$ is offset relative to the invalidity signal 36 by a predetermined time interval, namely Tδ. The predetermined time interval Tδ is substantially equal to the longest pulse-width "glitch" that can be inhibited or suppressed by the deglitch circuit 24. Selection of the predetermined time interval Tδ depends on several factors including (i) the time interval that it takes for any one of the page select signals to transition from a first state to a second state or vice-versa (i.e., the "edge rate" of any one of the page select signals), and (ii) the respective propagation delays of the various paths through combinational circuit 22 (as well as the respective differences in propagation delay between any two paths in circuit 22).

Figure 4:
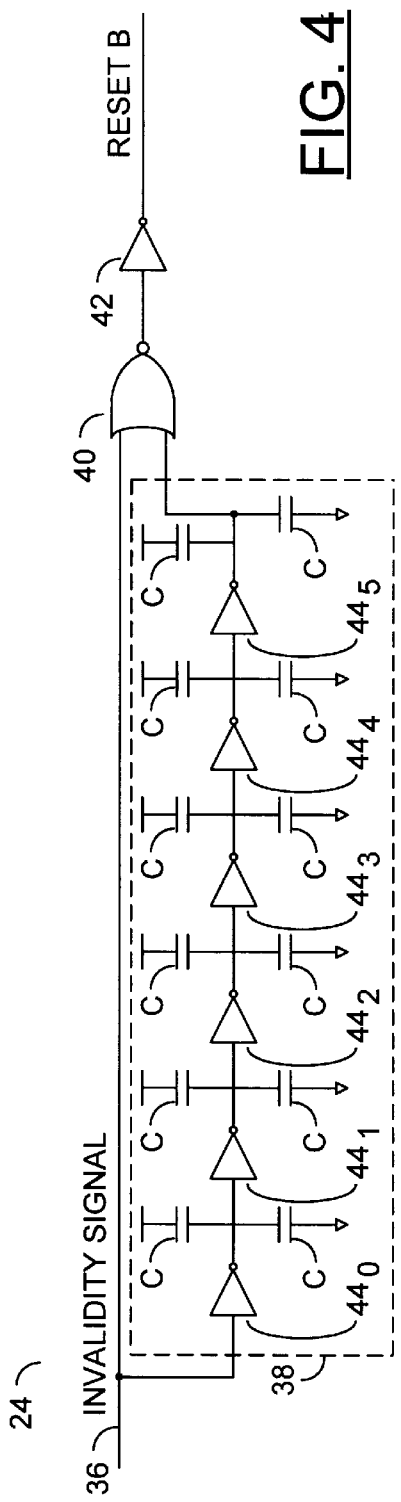
FIG. 4 is a simplified schematic diagram view illustrating, in greater detail, the deglitch circuit shown in FIG. 3.

FIG. 4 shows a simplified schematic diagram of deglitch circuit 24, showing delay circuit 38 in greater detail. Delay circuit 38 may include an even number of inverting buffers $44_0$, $44_1$, ..., $44_5$, as well as a plurality of capacitors, designated C. An even number of inverting buffers 44 maintains the logical sense of the invalidity signal 36 (i.e., a logic high invalidity signal 36 will be maintained as a logic high $36_{delayed}$, and a logic low invalidity signal 36 will be maintained as a logic low $36_{delayed}$). The capacitors C, which are coupled to the output terminal of each inverting buffer, are provided to delay the output transition time of each inverting buffer $44_i$ (by providing, in effect, a load which must be charged and discharged for a change in state to occur). As illustrated in FIG. 4, each inverting buffer has, on its output, one capacitor coupled to ground, and another capacitor coupled to the positive power supply.

Figure 5:
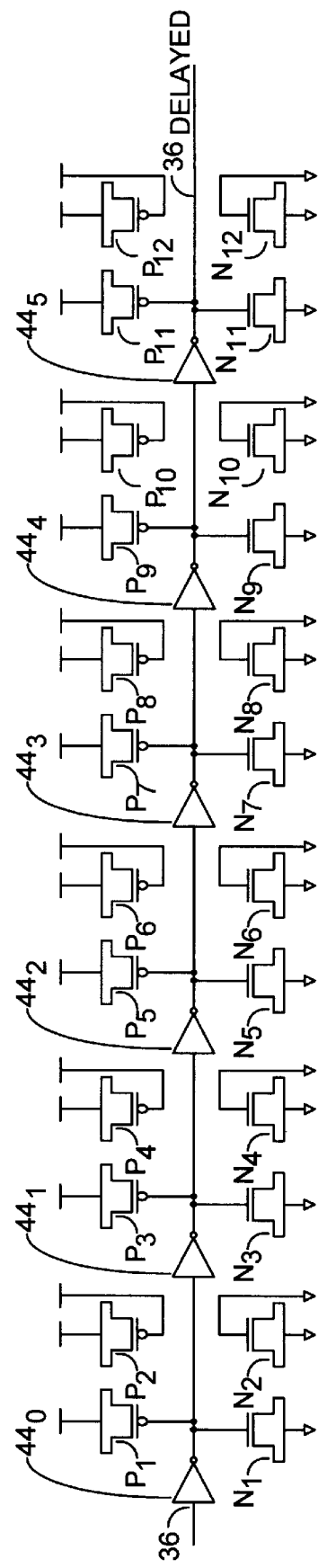
FIG. 5 is a simplified schematic diagram view showing one embodiment of the delay block shown in FIG. 4.

FIG. 5 shows delay circuit 38, shown in FIG. 3 in block diagram form, in even greater detail. In particular, the capacitors C coupled to each inverting buffer output may be formed using PMOS transistors $P_1$–$P_{12}$, and NMOS transistors $N_1$–$N_{12}$, respectively configured as capacitors (e.g., the gate terminal configured as a first capacitor terminal, the drain and source terminals being connected together to define a second capacitor terminal wherein the gate oxide forms the capacitor dielectric).

FIGS. 6A–6E are timing diagrams showing the operation of the present invention. FIGS. 6A, and 6B show exemplary waveforms for the page select signals designated PAGE1, and PAGE2 (see FIG. 1). Note page select signals PAGE0, and PAGE3 (not illustrated) are defined as LOW (logic 0) in the timing diagram. As shown in FIG. 6C, a "glitch" (i.e., an asserted condition of invalidity signal 36 that is NOT indicative of an invalid state) is generated at the output of combinational circuit 22. This is due, in the illustration, to state transitions during interval 46 of the page select signals, PAGE1, and PAGE2. Note that the relative levels of the page select signals PAGE1, and PAGE2, during transition interval 48, are such as to result in a "glitch". Unless inhibited or otherwise suppressed, the "glitch" 50 illustrated in FIG. 6C would reset the synchronous shift register 20—which is undesirable under these circumstances.

FIG. 6D shows glitch 50 illustrated in FIG. 6C, delayed by a predetermined amount Tδ.

FIG. 6E shows the output of inverter 42. In order for the reset signal RESETB to be driven low (an asserted condition), both inputs to NOR gate 40 must be low. This condition will not be satisfied for glitches having a pulse-width less than Tδ. Therefore, as shown in FIG. 6E, glitch 50 is effectively filtered out (suppressed or inhibited). However, as shown for interval 52, both page select signals PAGE1, and PAGE2 assume active high states (i.e., collectively defining an invalid state in a constructed embodiment). This condition persists for greater than a Tδ time interval—thus it will not be suppressed or inhibited by deglitch circuit 24. Therefore, as shown in FIG. 6E, the reset signal RESETB will be taken low, which is an active state in the illustrative embodiment.

An integrated circuit in accordance with the present invention provides state-of-the-art performance levels in generating needed page select signals. The invention also performs a power-on-reset function in the preferred embodiment, and provides the function of monitoring for invalid states during normal operation. In either case, the invention is operative to "reset" the page enable circuit (e.g., the synchronous shift register in the preferred embodiment) should an invalid state be detected. Once "reset," the page enable circuit outputs a valid state.

While the invention has been particularly shown and described with reference to the preferred embodiments thereof, it is well understood by those skilled in the art that various changes and modifications can be made in the invention without departing from the spirit and scope thereof. For example, combinational circuit 22, and deglitch circuit 24 may be replaced by synchronous logic or an alternative type of logic to fully complementary CMOS. In addition, the method and apparatus of performing the power-on-reset function can be applied to any synchronous circuit and/or circuit designed using output latches which have a number of predefined valid output states which are less than the total number of possible output states.

I claim:

1. An integrated circuit having a memory, said integrated circuit comprising:

a page enable circuit configured to generate a plurality of page select signals to enable a selected one of a plurality of pages of said memory;

a combinational circuit configured to assert an invalidity signal when said page select signals define said invalid state;

a deglitch circuit configured to inhibit asserted conditions of said invalidity signal that are not indicative of said invalid state to generate a reset signal; and said page enable circuit being further configured to generate said page select signals in a valid state in response to said reset signal.

2. The integrated circuit of claim 1 wherein said page enable circuit is further configured to generate said page select signals in accordance with a clock signal.

3. The integrated circuit of claim 2 wherein said page enable circuit includes a synchronous shift register.

4. The integrated circuit of claim 1 wherein said asserted conditions of said invalidity signal not indicative of said invalid state occur due to transitions of said page select signals.

5. The integrated circuit of claim 1 wherein said deglitch circuit includes:

a delay circuit configured to receive said invalidity signal and to generate a delayed version of said invalidity signal in response thereto;

a NOR gate configured to receive said invalidity signal and said delayed version of said invalidity signal and generate said reset signal in response thereto.

6. The integrated circuit of claim 5 wherein said delayed version of said invalidity signal is offset relative to said invalidity signal by a predetermined time interval, said predetermined time interval being substantially equal to the longest pulsewidth of an asserted condition of said invalidity signal that can be inhibited by said deglitch circuit.

7. The integrated circuit of claim 1 further comprising a decoder.

8. An integrated circuit having a memory, said integrated circuit comprising:

a page enable circuit configured to generate a plurality of page select signals to enable a selected one of a plurality of pages of said memory;

a combinational circuit configured to assert an invalidity signal when said page select signals define an invalid state;

a deglitch circuit configured to inhibit asserted conditions of said invalidity signal that are not indicative of said invalid state to generate a reset signal, said page enable circuit being further configured to generate said page select signals in a valid state in response to said reset signal.

9. The integrated circuit of claim 8 wherein said page enable circuit includes a synchronous shift register configured to generate said page select signals in accordance with a clock signal.

10. The integrated circuit of claim 9 wherein said deglitch circuit includes:

a delay circuit configured to receive said invalidity signal and to generate a delayed version of said invalidity signal in response thereto;

a NOR gate configured to receive said invalidity signal and said delayed version of said invalidity signal and generate said reset signal in response thereto.

11. A method of operating an integrated circuit including a memory having a plurality of pages, said method comprising the steps of:

(A) generating a plurality of page select signals to enable a selected one of a plurality of pages of said memory;

(B) asserting an invalidity signal when said page select signals define said invalid state;

(C) inhibiting asserted conditions of said invalidity signal that are not indicative of said invalid state to generate a reset signal;

(D) modifying said plurality of page select signals to define a valid state in response to said reset signal.

12. The method of claim 11 further including the step of generating said plurality of page select signals in accordance with a clock signal.

13. The method of claim 11 wherein step (D) includes the substep of:

resetting a shift register whose output defines the page select signals in response to the reset signal.

* * * * *